(12) United States Patent
Hattori (10) Patent No.: US 10,580,697 B2
(45) Date of Patent: Mar. 3, 2020

(54) WORKPIECE DIVIDING METHOD

(71) Applicant: DISCO CORPORATION, Tokyo (JP)

(72) Inventor: Nao Hattori, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 15/946,293

(22) Filed: Apr. 5, 2018

(65) Prior Publication Data

US 2018/0301378 A1    Oct. 18, 2018

(30) Foreign Application Priority Data

Apr. 13, 2017    (JP) ................................ 2017-079994

(51) Int. Cl.

| | | |
|---|---|---|
| H01L 21/78 | (2006.01) | |
| H01L 21/67 | (2006.01) | |
| H01L 21/268 | (2006.01) | |
| H01L 21/324 | (2006.01) | |
| H01L 21/683 | (2006.01) | |

(52) U.S. Cl.
CPC ............ *H01L 21/78* (2013.01); *H01L 21/268* (2013.01); *H01L 21/324* (2013.01); *H01L 21/67092* (2013.01); *H01L 21/67132* (2013.01); *H01L 21/6836* (2013.01); *H01L 21/67103* (2013.01); *H01L 21/6838* (2013.01); *H01L 2221/68336* (2013.01)

(58) Field of Classification Search
CPC . H01L 21/78; H01L 21/67132; H01L 21/324; H01L 21/67092; H01L 21/268; H01L 21/6836; H01L 2221/68336; H01L 21/6838; H01L 21/67103

USPC ......................................................... 438/462
See application file for complete search history.

(56) References Cited

U.S. PATENT DOCUMENTS

| | | | |
|---|---|---|---|
| 2005/0101109 A1* | 5/2005 | Chin ................. | H01L 21/67092 438/464 |
| 2006/0030129 A1* | 2/2006 | Ohmiya ............ | H01L 21/67132 438/462 |
| 2006/0197260 A1* | 9/2006 | Yoshikawa ............ | B23K 26/10 264/482 |
| 2013/0084599 A1* | 4/2013 | Morimoto .............. | G01N 1/286 435/40.52 |
| 2013/0280495 A1* | 10/2013 | Matsumoto ........... | C03B 33/091 428/172 |

(Continued)

FOREIGN PATENT DOCUMENTS

JP        2016040810 A     3/2016

*Primary Examiner* — Anthony Ho
*Assistant Examiner* — Mohammad M Hoque
(74) *Attorney, Agent, or Firm* — Greer Burns & Crain, Ltd.

(57) ABSTRACT

There is provided a dividing method for dividing a plate-shaped workpiece. The dividing method includes: a starting point region forming step of forming a starting point region serving as a starting point of division along a planned dividing line set on the workpiece; a heating step of heating the workpiece after performing the starting point region forming step; a cooling step of cooling the workpiece after performing the heating step; a dividing step of dividing the workpiece along the starting point region by applying a force to the workpiece after performing the cooling step; and a sheet affixing step of affixing an expanding sheet to the workpiece before performing the dividing step; the dividing step applying the force to the workpiece by expanding the expanding sheet.

14 Claims, 8 Drawing Sheets

(56) References Cited

U.S. PATENT DOCUMENTS

2015/0159821 A1* 6/2015 Arakawa .............. B23K 26/402
                                                        216/24
2017/0323774 A1* 11/2017 Kirihara ............... B23K 26/032

* cited by examiner

WORKPIECE DIVIDING METHOD

BACKGROUND OF THE INVENTION

Field of the Invention

The present invention relates to a dividing method for dividing a plate-shaped workpiece.

Description of the Related Art

In an electronic apparatus typified by a mobile telephone or a personal computer, a device chip including a device such as an electronic circuit or the like is an essential constituent element. Device chips are, for example, obtained by demarcating the top surface of a wafer formed of a material such as silicon (Si) or the like by a plurality of planned dividing lines (streets), forming devices in respective regions, and thereafter dividing the wafer along the planned dividing lines.

As a method of dividing a workpiece such as the wafer described above or the like, there is a known method which forms a modified layer (modified region) modified by multiphoton absorption by condensing a laser beam having transparency inside the workpiece. The modified layer is formed along a planned dividing line, and thereafter the planned dividing line is pressurized by using a thin plate-shaped (blade-shaped) member, for example. The workpiece can be thereby divided with the modified layer as a starting point (see, for example, Japanese Patent Laid-open No. 2016-40810 and the like).

SUMMARY OF THE INVENTION

However, when a force is applied to the workpiece by using a thin plate-shaped member as described above, there is a possibility that a chip formed by the division moves, comes into contact with an adjacent chip, and is damaged. On the other hand, the workpiece may be divided by applying a force by a method of expanding an expanding sheet (expanding tape) made of a resin which expanding sheet (expanding tape) is affixed (stuck) to the workpiece.

In this method, the force acts only in a direction of increasing intervals between adjacent chips. The chips are therefore prevented from coming into contact with each other and being damaged. However, in this method, the force may be insufficient when dividing, for example, a workpiece having high hardness, a thick workpiece, a workpiece having a large number of planned dividing lines (small chips), or the like. Therefore, the workpiece as a whole may be unable to be divided appropriately.

It is accordingly an object of the present invention to provide a dividing method that can divide a workpiece in entirety thereof more surely without chips coming into contact with each other.

In accordance with an aspect of the present invention, there is provided a dividing method for dividing a plate-shaped workpiece, the dividing method including: a starting point region forming step of forming a starting point region serving as a starting point of division along a planned dividing line set on the workpiece; a heating step of heating the workpiece after performing the starting point region forming step; a cooling step of cooling the workpiece after performing the heating step; a dividing step of dividing the workpiece along the starting point region by applying a force to the workpiece after performing the cooling step; and a sheet affixing step of affixing an expanding sheet to the workpiece before performing the dividing step; the dividing step applying the force to the workpiece by expanding the expanding sheet.

In the above aspect of the present invention, the starting point region forming step may form a plurality of fine holes reaching one surface from an inside of the workpiece along the planned dividing line by irradiating the workpiece with a laser beam.

The dividing method according to the above aspect of the present invention forms a starting point region serving as a starting point of division along a planned dividing line set on a workpiece, and thereafter heats the workpiece. Thus, cracks are further extended from the starting point region of the workpiece, and the starting point region of the workpiece and the periphery thereof are made further brittle. Therefore, when a force in a direction of expanding the expanding sheet is applied after the workpiece is heated, the workpiece can be divided more surely along the planned dividing line.

In addition, the dividing method according to the above aspect of the present invention does not need to pressurize the workpiece by using a thin plate-shaped (blade-shaped) member. Therefore, chips adjacent to each other are prevented from moving in an approaching direction and coming into contact with each other. Thus, the dividing method according to the above aspect of the present invention can more surely divide the workpiece in entirety thereof without chips coming into contact with each other.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described with reference to the accompanying drawings.

First Embodiment

Figure 1A:
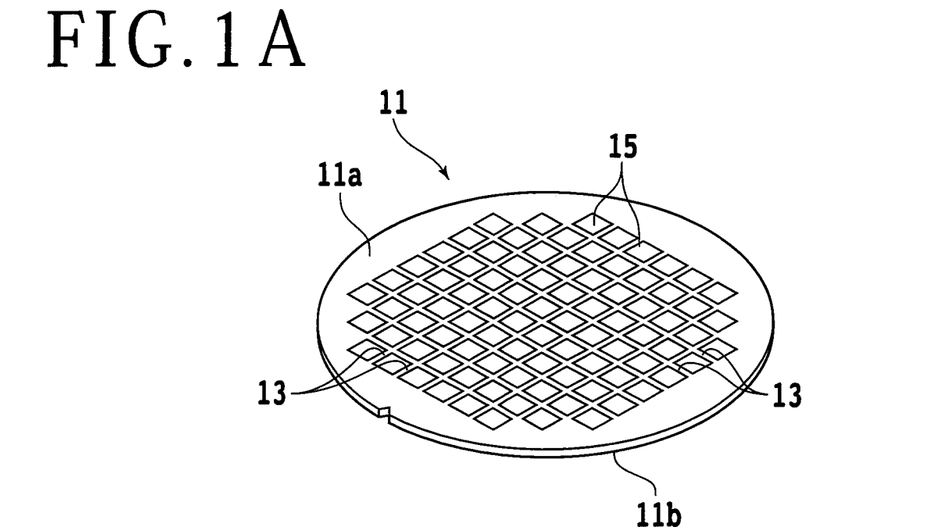
FIG. 1A is a perspective view schematically showing an example of configuration of a workpiece to be divided by a dividing method according to a first embodiment.

In a present embodiment, description will be made of a dividing method that forms a modified layer (starting point region) modified by multiphoton absorption by condensing a laser beam having transparency inside a workpiece, and thereafter divides the workpiece with the modified layer as a starting point. FIG. 1A is a perspective view schematically showing an example of configuration of a workpiece 11 to be divided by the dividing method according to the present embodiment. As shown in FIG. 1A, the workpiece 11 is, for example, a disk-shaped wafer formed of a material such as silicon (Si) or the like. A top surface 11a side of the workpiece 11 is demarcated into a plurality of regions by planned dividing lines (streets) 13 set in a lattice manner. A device 15 such as an IC (Integrated Circuit) or the like is formed in each region.

Incidentally, in the present embodiment, a disk-shaped wafer formed of a material such as silicon or the like is used as the workpiece 11. However, the material, shape, structure, size, and the like of the workpiece 11 are not limited. It is also possible to use a workpiece 11 formed of a material such as another semiconductor (for example, GaN, SiC, or the like), a ceramic (for example, sapphire, lithium tantalate, lithium niobate, or the like), a resin, a metal, or the like. Similarly, the kind, quantity, shape, structure, size, arrangement, and the like of the devices 15 are not limited.

Figure 1B:
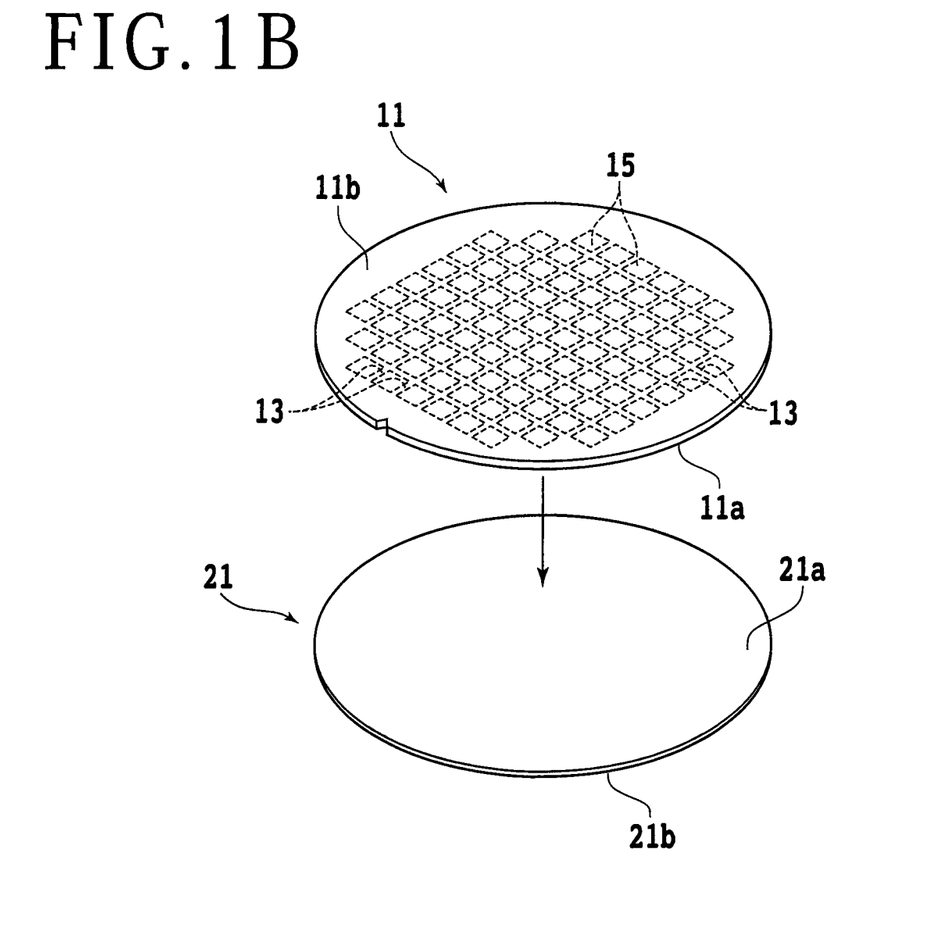
FIG. 1B is a perspective view of assistance in explaining a protective member affixing step.

In the dividing method according to the present embodiment, a protective member affixing step is first performed which affixes (sticks) a protective member to the top surface 11a side of the workpiece 11 described above. FIG. 1B is a perspective view of assistance in explaining the protective member affixing step. A protective member 21 is, for example, a circular film (sheet or tape) having a diameter equal to that of the workpiece 11. A top surface 21a side of the protective member 21 is provided with a glue layer (adhesive material layer) having an adhesive force. Therefore, the protective member 21 can be affixed to the top surface 11a side of the workpiece 11 by bringing the top surface 21a side into close contact with the top surface 11a side of the workpiece 11. By affixing such a protective member 21, it is possible to cushion a shock applied to the workpiece 11 in each subsequent step, and thus protect the devices 15 and the like arranged on the top surface 11a side.

Figure 2A:
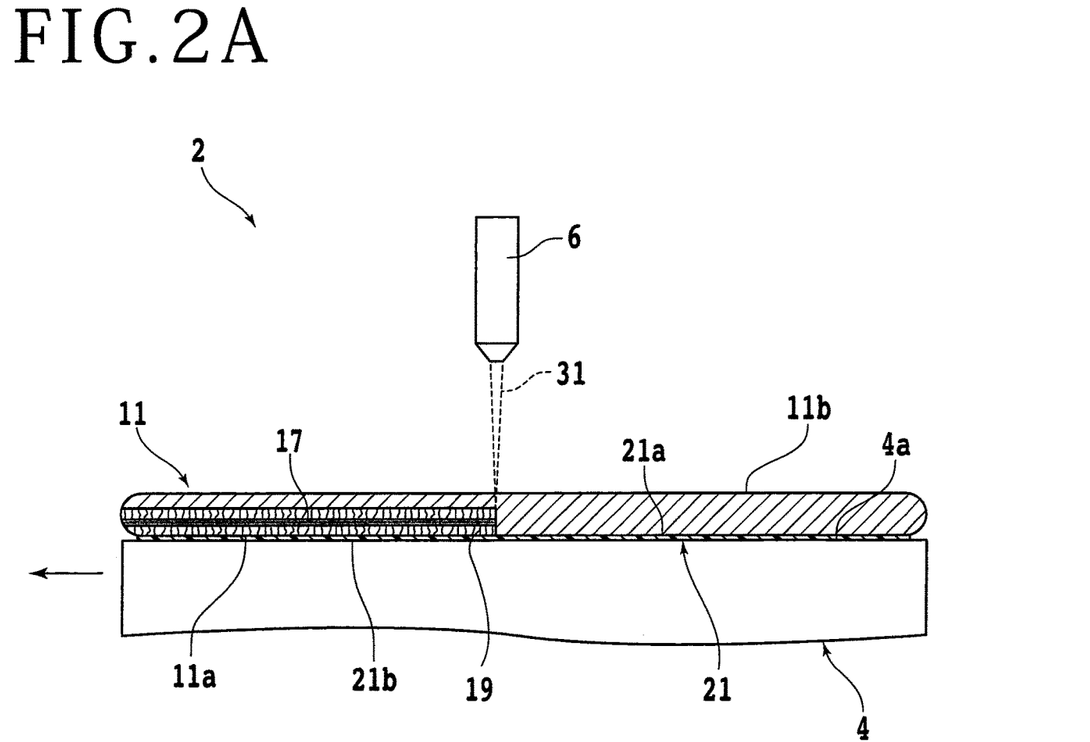
FIG. 2A is a partially sectional side view of assistance in explaining a modified layer forming step.

After the protective member affixing step, a modified layer forming step (starting point region forming step) is performed which forms a modified layer (starting point region) serving as a starting point of division inside the workpiece 11 by applying a laser beam capable of passing through the workpiece 11 along the planned dividing lines 13. FIG. 2A is a partially sectional side view of assistance in explaining the modified layer forming step. The modified layer forming step is, for example, performed by using a laser irradiating apparatus 2 shown in FIG. 2A. The laser irradiating apparatus 2 includes a chuck table 4 for sucking and holding the workpiece 11. The chuck table 4 is coupled to a rotation-driving source (not shown) such as a motor or the like, and rotates about a rotation axis substantially parallel with a vertical direction. In addition, a moving mechanism (not shown) is provided below the chuck table 4. The chuck table 4 is moved in a horizontal direction by this moving mechanism.

A part of a top surface of the chuck table 4 is a holding surface 4a that sucks and holds the workpiece 11. The holding surface 4a is connected to a suction source (not shown) through a suction passage (not shown) or the like formed inside the chuck table 4. Therefore, when the protective member 21 affixed to the workpiece 11 is brought into contact with the holding surface 4a, and a negative pressure of the suction source is made to act, for example, the workpiece 11 is sucked and held by the chuck table 4. A laser irradiating unit 6 is disposed above the chuck table 4. The laser irradiating unit 6 applies and condenses a laser beam 31 pulse-oscillated by a laser oscillator (not shown) to a predetermined position. The laser oscillator is configured to be able to pulse-oscillate the laser beam 31 having a wavelength capable of passing through (wavelength not easily absorbed by) the workpiece 11.

In the modified layer forming step, first, an undersurface 21b of the protective member 21 affixed to the workpiece 11 is brought into contact with the holding surface 4a of the chuck table 4, and the negative pressure of the suction source is made to act. Thus, the workpiece 11 is sucked and held by the chuck table 4 in a state in which an undersurface 11b side of the workpiece 11 is exposed upward. Next, the laser irradiating unit 6 is adjusted to a position above an extension of a target planned dividing line 13, for example, by moving and rotating the chuck table 4. Then, as shown in FIG. 2A, the chuck table 4 is moved in a direction parallel with the target planned dividing line 13 while the laser beam 31 is applied from the laser irradiating unit 6 to the undersurface 11b side of the workpiece 11. Here, the laser beam 31 is condensed to a position of a predetermined depth inside the workpiece 11. When the laser beam 31 having a wavelength capable of passing through the workpiece 11 is thus condensed inside the workpiece 11, the inside of the workpiece 11 is modified by multiphoton absorption, so that a modified layer (starting point region) 17 as a starting point of division can be formed.

The modified layer forming step is ended when the modified layer 17 is formed along all of the planned dividing lines 13 by repeating the operation as described above. Incidentally, as shown in FIG. 2A, the modified layer 17 is preferably formed under a condition that cracks (starting point regions) 19 reach the top surface 11a (or the undersurface 11b). The workpiece 11 can be thereby divided more appropriately. In addition, for each of the planned dividing lines 13, a plurality of modified layers 17 may be formed at different depth positions.

Figure 2B:
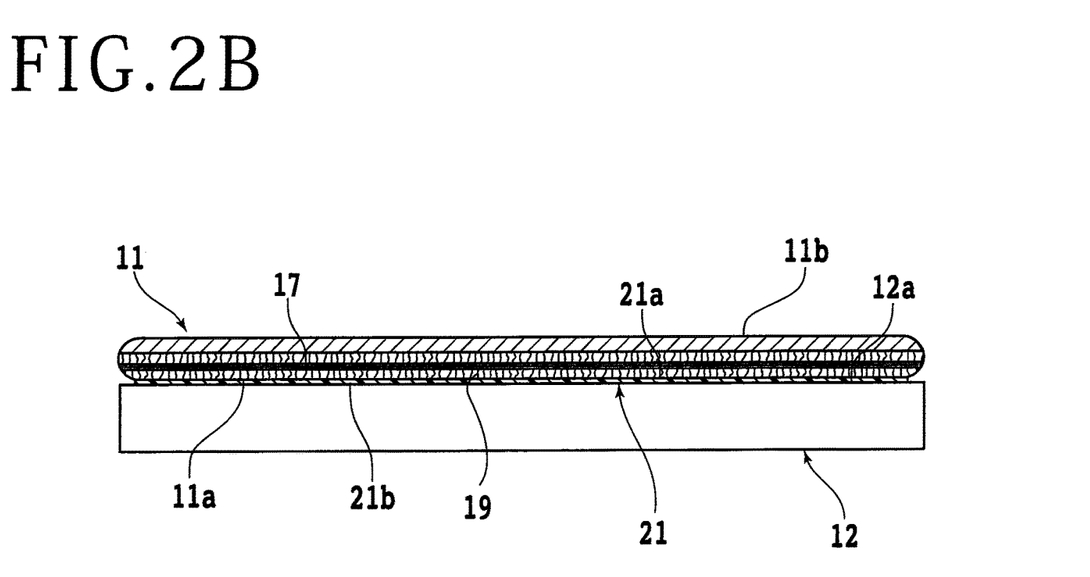
FIG. 2B is a partially sectional side view of assistance in explaining a heating step.

After the modified layer forming step, a heating step of heating the workpiece 11 is performed. FIG. 2B is a partially sectional side view of assistance in explaining the heating step. The heating step is performed by using a hot plate 12 shown in FIG. 2B, for example. The hot plate 12 has a heating surface 12a that can be adjusted to an arbitrary temperature.

In the heating step, the undersurface 21b of the protective member 21 affixed to the workpiece 11 is brought into contact with the heating surface 12a of the hot plate 12, and the temperature of the heating surface 12a is increased. The workpiece 11 is thereby heated by the heating surface 12a, so that the cracks 19 can be further extended from the modified layer 17 or the peripheries of the modified layer 17 and the cracks 19 can be made brittle. The temperature and time of the heating are set arbitrarily within a range in which the cracks 19 can be further extended from the modified layer 17 or the peripheries of the modified layer 17 and the cracks 19 can be made brittle. In the present embodiment, for example, the temperature of the heating surface 12a is set at 180° C., and the time of the heating is set at one minute.

After the heating step, a cooling step of cooling the workpiece 11 is performed. In this cooling step, the workpiece 11 is cooled to such a degree that a subsequent step can be carried out appropriately. Specifically, for example, it is desirable to cool the workpiece 11 to a temperature of 50° C. or lower, preferably 40° C. or lower. A cooling method is not particularly limited. However, the workpiece 11 may be cooled by a method of placing the workpiece 11 under an environment of room temperature, for example. In addition, the workpiece 11 may be cooled by, for example, sprinkling water or the like over the workpiece 11 to shorten a time taken for the cooling.

Incidentally, the heating step and the cooling step described above may be performed repeatedly. When the heating step and the cooling step are repeated two to three times, for example, the cracks 19 can be extended from the modified layer 17 sufficiently, or the peripheries of the modified layer 17 and the cracks 19 can be made sufficiently brittle.

Figure 3:
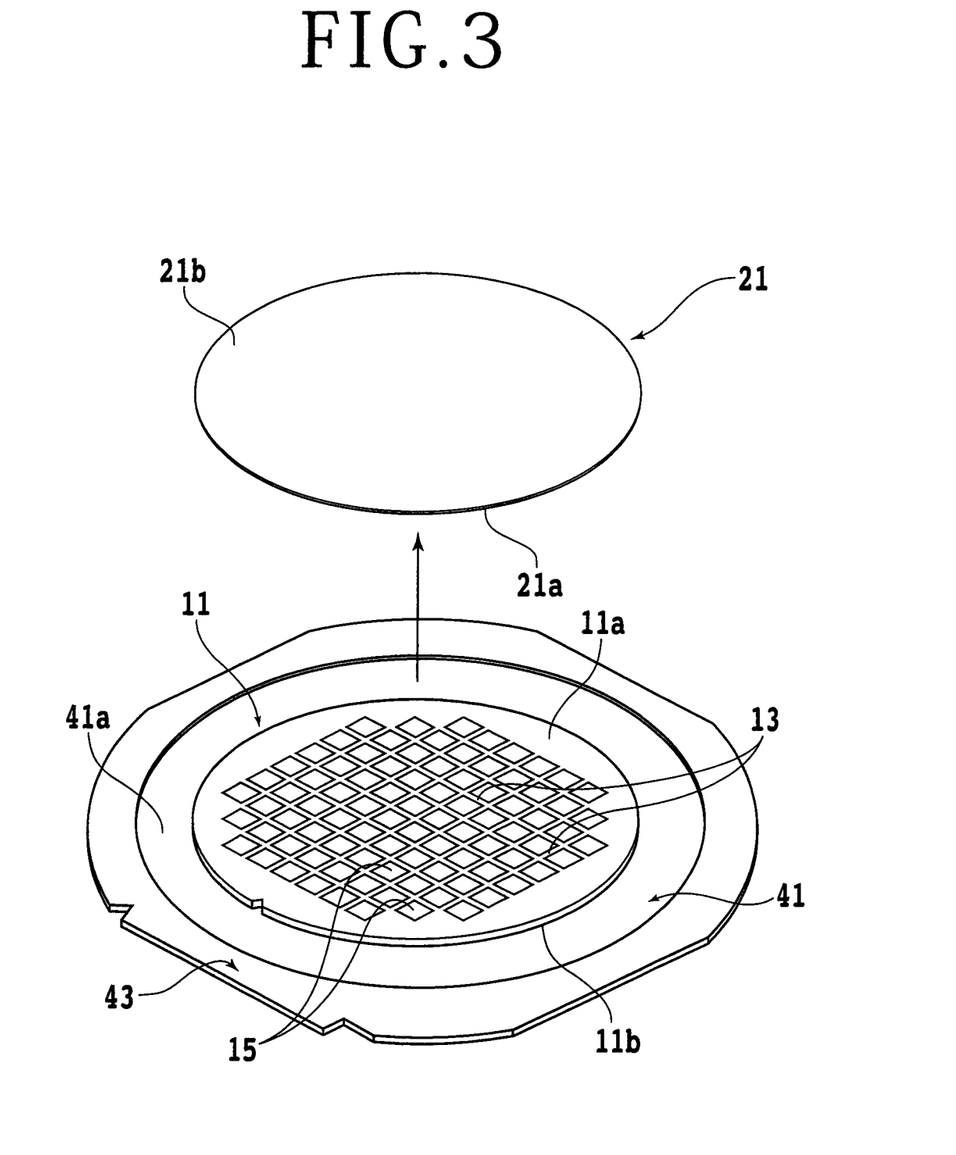
FIG. 3 is a perspective view of assistance in explaining a sheet affixing step.

After the cooling step, a sheet affixing step is performed which affixes (sticks) an expanding sheet to the undersurface 11b side of the workpiece 11. FIG. 3 is a perspective view of assistance in explaining the sheet affixing step. An expanding sheet 41 is, for example, a circular film (tape or sheet) having a larger diameter than the workpiece 11. A top surface 41a side of the expanding sheet 41 is provided with a glue layer (adhesive material layer) having an adhesive force. Therefore, the expanding sheet 41 can be affixed to the undersurface 11b side of the workpiece 11 by bringing a central part of the top surface 41a side into close contact with the undersurface 11b side of the workpiece 11, for example. On the other hand, an annular frame 43 encircling the workpiece 11 is fixed to an outer peripheral portion on the top surface 41a side of the expanding sheet 41. The workpiece 11 is thereby supported by the annular frame 43 via the expanding sheet 41. After the expanding sheet 41 is affixed to the undersurface 11b side of the workpiece 11, the top surface 11a of the workpiece 11 is exposed by peeling off and removing the protective member 21 affixed to the top surface 11a side of the workpiece 11, as shown in FIG. 3. Incidentally, the protective member 21 may be peeled off and removed before the expanding sheet 41 is affixed to the undersurface 11b side of the workpiece 11.

Figure 4A:
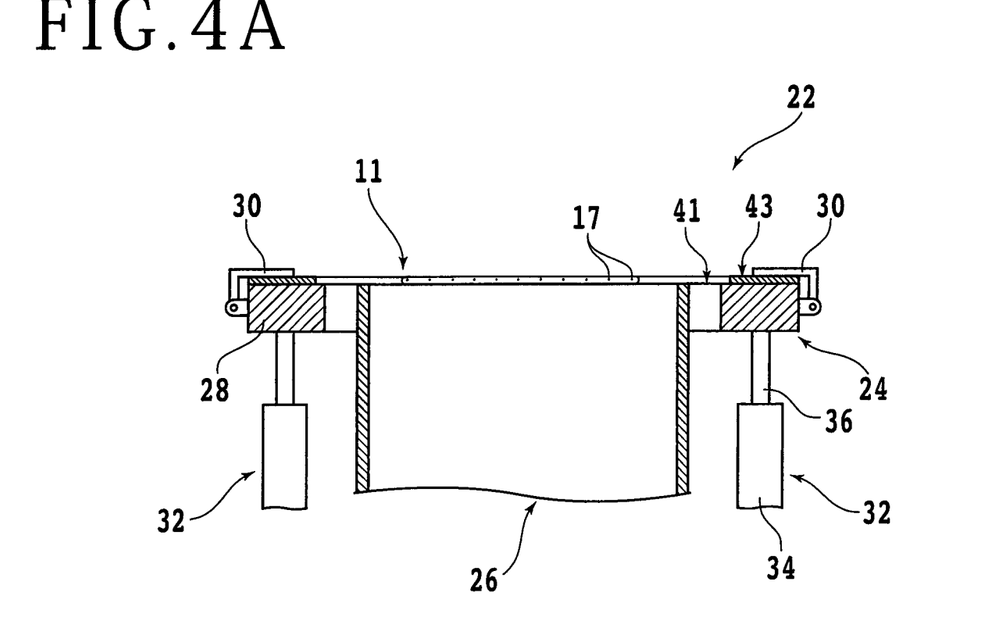
FIG. 4A and FIG. 4B are partially sectional side views of assistance in explaining a dividing step.
Figure 4B:
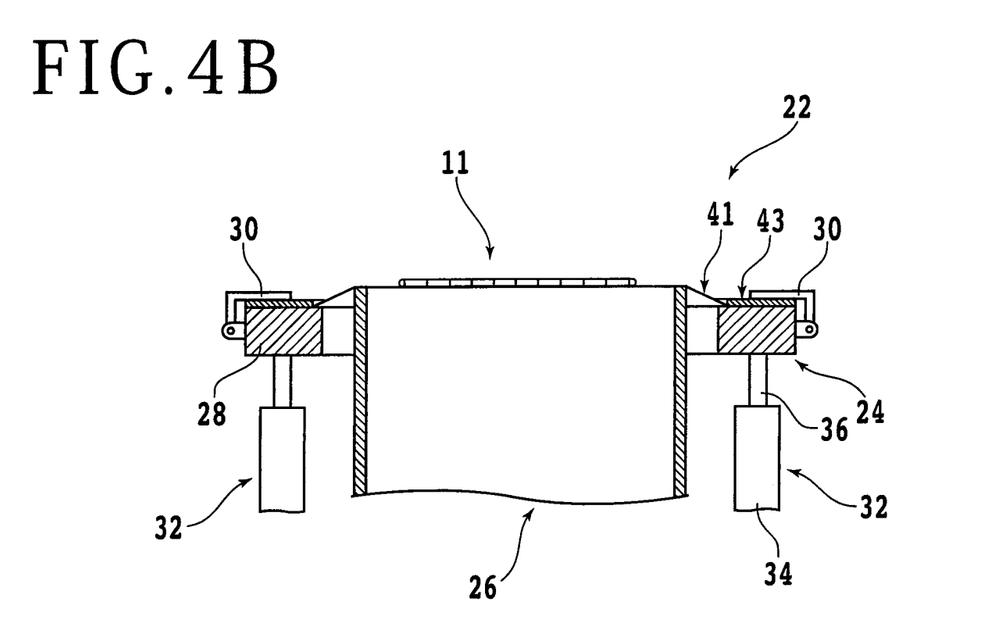

After the sheet affixing step, a dividing step is performed which applies a force to the workpiece 11 by expanding the expanding sheet 41, and thus divides the workpiece 11 along the modified layer 17. FIG. 4A and FIG. 4B are partially sectional side views of assistance in explaining the dividing step. The dividing step is performed by using an expanding apparatus 22 shown in FIG. 4A and FIG. 4B, for example. The expanding apparatus 22 includes a supporting structure 24 for supporting the workpiece 11 and a cylindrical expanding drum 26. The supporting structure 24 includes a supporting table 28 having a circular opening portion as viewed in plan. The annular frame 43 is placed on a top surface of the supporting table 28. A plurality of clamps 30 for fixing the frame 43 are arranged on an outer peripheral part of the supporting table 28. The supporting table 28 is supported by a raising and lowering mechanism 32 for raising and lowering the supporting structure 24.

The raising and lowering mechanism 32 includes cylinder cases 34 fixed to a base (not shown) below and piston rods 36 inserted in the cylinder cases 34. The supporting table 28 is fixed to upper end portions of the piston rods 36. The raising and lowering mechanism 32 raises and lowers the supporting structure 24 by moving the piston rods 36 up and down. The expanding drum 26 is disposed in an opening portion of the supporting table 28. The inside diameter (diameter) of the expanding drum 26 is larger than the diameter of the workpiece 11. On the other hand, the outside diameter (diameter) of the expanding drum 26 is smaller than the inside diameter (diameter) of the annular frame 43 and the diameter of the opening portion of the supporting table 28.

In the dividing step, first, as shown in FIG. 4A, the height of the top surface of the supporting table 28 is adjusted to the height of an top end of the expanding drum 26, the frame 43 is placed on the top surface of the supporting table 28, and thereafter the frame 43 is fixed by the clamps 30. The top end of the expanding drum 26 thereby comes into contact with the expanding sheet 41 between the workpiece 11 and the frame 43. Next, as shown in FIG. 4B, the top surface of the supporting table 28 is moved to a position below the top end of the expanding drum 26 by lowering the supporting structure 24 by the raising and lowering mechanism 32. As a result, the expanding drum 26 is raised with respect to the supporting table 28, and the expanding sheet 41 is lifted up by the expanding drum 26 and radially expanded. When the expanding sheet 41 is expanded, a force in a direction of expanding the expanding sheet 41 (radial force) acts on the workpiece 11. The workpiece 11 is thereby divided into a plurality of chips with the modified layer 17 and the cracks 19 as a starting point.

Thus, the dividing method according to the present embodiment forms the modified layer (starting point region) 17 and the cracks (starting point regions) 19 as a starting point of division along the planned dividing lines 13 set in the workpiece 11, and thereafter heats the workpiece 11. Therefore, the cracks 19 are further extended from the modified layer 17 of the workpiece 11, and the modified layer 17 and the cracks 19 of the workpiece 11 and the peripheries thereof are made further brittle. Consequently, when the force in the direction of expanding the expanding sheet 41 is applied after the workpiece 11 is heated, the workpiece 11 can be divided more surely along the planned dividing lines 13. In addition, the dividing method according to the present embodiment does not need to pressurize the workpiece 11 by using a thin plate-shaped (blade-shaped) member. Therefore, chips adjacent to each other are prevented from moving in an approaching direction and coming into contact with each other. Thus, the dividing method according to the present embodiment can more surely divide the workpiece 11 in entirety thereof without chips coming into contact with each other.

Second Embodiment

Figure 5:
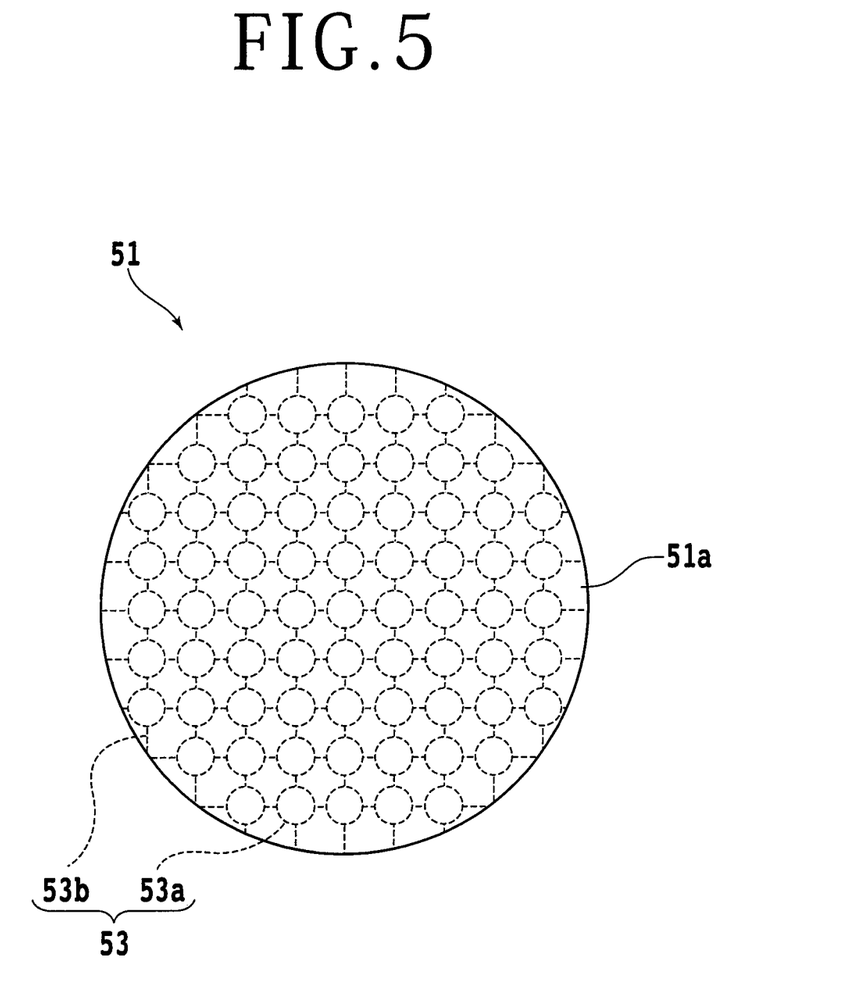
FIG. 5 is a plan view schematically showing an example of configuration of a workpiece to be divided by a dividing method according to a second embodiment.

In a present embodiment, description will be made of a dividing method that forms a plurality of fine holes (starting point regions) reaching a top surface or an undersurface of a workpiece from the inside of the workpiece by condensing a laser beam having transparency inside the workpiece, and thereafter divides the workpiece with the fine holes as a starting point. FIG. 5 is a plan view schematically showing an example of configuration of a workpiece 51 to be divided by a dividing method according to the present embodiment. As shown in FIG. 5, the workpiece 51 is, for example, a disk-shaped glass substrate formed of a material such as a soda-lime glass, a borosilicate glass, an aluminosilicate glass, or the like. Planned dividing lines 53 are set on a top surface 51a side (or an undersurface 51b side) of the workpiece 51. The planned dividing lines 53, for example, include a plurality of planned dividing lines 53a set in a circular shape and a plurality of planned dividing lines 53b set in a linear shape. The linear planned dividing lines 53b are set so as to connect the planned dividing lines 53a to an outer peripheral edge of the workpiece 51 or connect adjacent planned dividing lines 53a to each other. Hence, when the workpiece 51 is divided along the planned dividing lines 53a and the planned dividing lines 53b, a plurality of disk-shaped chips corresponding to the plurality of planned dividing lines 53a are obtained.

Incidentally, while a disk-shaped glass substrate is used as the workpiece 51 in the present embodiment, the material, shape, structure, size, and the like of the workpiece 51 are not limited. It is also possible to use a workpiece 51 formed of a material such as another ceramic (for example, sapphire, lithium tantalate, lithium niobate, or the like), a semiconductor (for example, GaN, SiC, or the like), a resin, a metal, or the like. Similarly, the shape, arrangement, and the like of the planned dividing lines 53 are not limited.

Figure 6A:
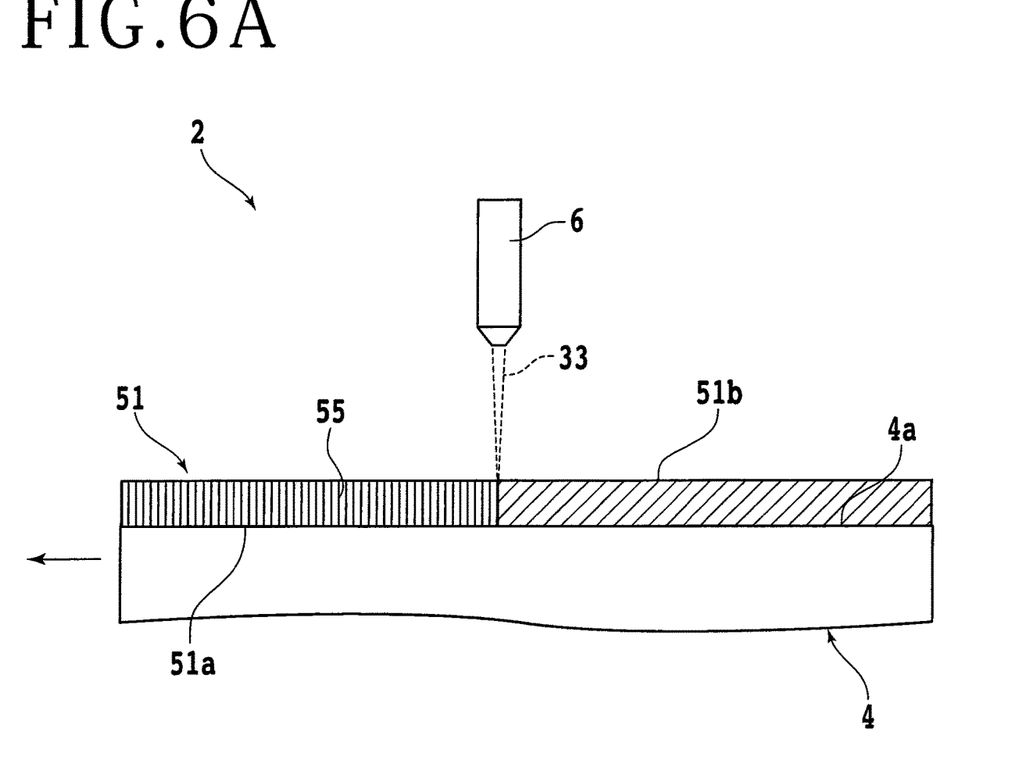
FIG. 6A is a partially sectional side view of assistance in explaining a fine hole forming step.

In the dividing method according to the present embodiment, a fine hole forming step (starting point region forming step) is first performed which applies a laser beam capable of passing through the workpiece 51 along the planned dividing lines 53, and thereby forms a plurality of fine holes (starting point regions) reaching the top surface 51a or the undersurface 51b from the inside of the workpiece 51. FIG. 6A is a partially sectional side view of assistance in explaining the fine hole forming step. As shown in FIG. 6A, the fine hole forming step according to the present embodiment is performed by using the laser irradiating apparatus 2 described in the first embodiment, for example. However, in the present embodiment, a lens such that a value obtained by dividing a numerical aperture (NA) of the lens by an index of refraction of the workpiece 51 is 0.05 to 0.2 is used as a lens for condensing of the laser irradiating unit 6. It is thereby possible to form a plurality of fine holes (starting point regions) 55 and an altered region surrounding each fine hole 55 in the workpiece 51.

In the fine hole forming step, first, the top surface 51a of the workpiece 51 is brought into contact with the holding surface 4a of the chuck table 4, and the negative pressure of a suction source is made to act. Thus, the workpiece 51 is sucked and held by the chuck table 4 in a state in which the undersurface 51b side of the workpiece 51 is exposed upward. Incidentally, the undersurface 51b may be brought into contact with the holding surface 4a of the chuck table 4 so that the top surface 51a side of the workpiece 51 is exposed upward. In addition, a protective member or the like may be interposed between the chuck table 4 and the workpiece 51. Next, the laser irradiating unit 6 is adjusted to a target planned dividing line 53, for example, by moving and rotating the chuck table 4. Then, as shown in FIG. 6A, while a laser beam 33 is applied from the laser irradiating unit 6 to the undersurface 51b side of the workpiece 51, the chuck table 4 is moved such that the laser beam 33 is applied along the target planned dividing line 53. Incidentally, FIG. 6A schematically shows a section along the planned dividing line 53 of the workpiece 51.

In this case, the laser beam 33 is condensed such that a condensing point (condensing region) extends in a region from the top surface 51a to the undersurface 51b of the workpiece 51. Thus, condensing the laser beam 33 having a wavelength capable of passing through the workpiece 51 in a region from the top surface 51a to the undersurface 51b of the workpiece 51 by using the above-described lens can form a plurality of fine holes 55 reaching the top surface 51a or the undersurface 51b from the inside of the workpiece 51 and an altered region surrounding each fine hole 55. That is, when the fine holes 55 and the altered regions surrounding the fine holes 55 are formed, the laser beam 33 is preferably condensed such that the condensing point extends in a region from the top surface 51a to the undersurface 51b of the workpiece 51 without the laser beam 33 being concentrated on one point inside the workpiece 51. Incidentally, a condensing point correcting plate or the like can be used to condense the laser beam 33 such that the condensing point extends in a region from the top surface 51a to the undersurface 51b of the workpiece 51. In addition, in this case, the laser beam 33 is applied under a condition (for example, the spot diameter and repetition frequency of the laser beam 33, the moving speed of the chuck table 4, and the like) such that the altered regions surrounding the fine holes 55 are continuous with each other along each planned dividing line 53. However, the fine holes 55 adjacent to each other need to be prevented from being connected to each other. The fine hole forming step is ended when fine holes 55 and altered regions are formed along all of the planned dividing lines 53 by repeating the operation as described above.

Incidentally, the order and the like of formation of the fine holes 55 and the altered regions are not particularly limited. For example, fine holes 55 and altered regions may be formed along the linear planned dividing lines 53b after fine holes 55 and altered regions are formed along the circular planned dividing lines 53a, or fine holes 55 and altered regions may be formed along the circular planned dividing lines 53a after fine holes 55 and altered regions are formed along the linear planned dividing lines 53b.

Figure 6B:
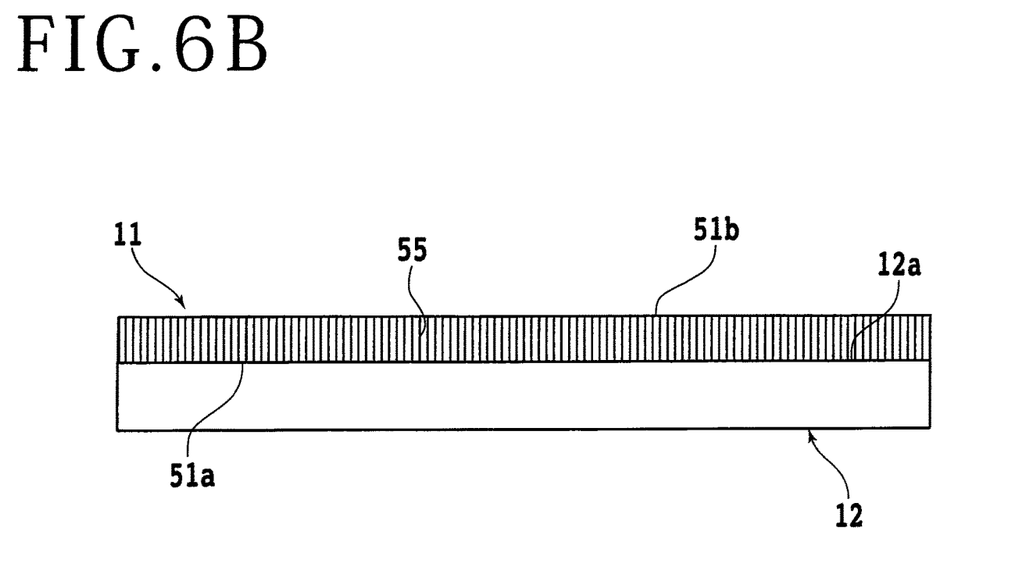
FIG. 6B is a partially sectional side view of assistance in explaining a heating step.

After the fine hole forming step, a heating step of heating the workpiece 51 is performed. FIG. 6B is a partially sectional side view of assistance in explaining the heating step. As shown in FIG. 6B, the heating step according to the present embodiment is also performed by using the hot plate 12 described in the first embodiment, for example.

In the heating step, the top surface 51a of the workpiece 51 is brought into contact with the heating surface 12a of the hot plate 12, and the temperature of the heating surface 12a is increased. The workpiece 51 is thereby heated by the heating surface 12a, so that cracks can be extended from the fine holes 55 and the altered regions, or the peripheries of the fine holes 55 and the altered regions can be made brittle. The temperature and time of the heating are set arbitrarily within a range in which cracks can be extended from the fine holes 55 and the altered regions or the peripheries of the fine holes 55 and the altered regions can be made brittle. In the present embodiment, for example, the temperature of the heating surface 12a is set at 180° C., and the time of the heating is set at one minute.

After the heating step, a cooling step of cooling the workpiece 51 is performed. In this cooling step, the workpiece 51 is cooled to such a degree that a subsequent step can be carried out appropriately. Specifically, for example, it is desirable to cool the workpiece 51 to a temperature of 50° C. or lower, preferably 40° C. or lower. A cooling method is not particularly limited. However, the workpiece 51 may be cooled by a method of placing the workpiece 51 under an environment of room temperature, for example. In addition, the workpiece 51 may be cooled by, for example, sprinkling water or the like over the workpiece 51 to shorten a time taken for the cooling.

Incidentally, the heating step and the cooling step described above may be performed repeatedly. When the heating step and the cooling step are repeated two to three times, for example, cracks can be extended from the fine holes 55 and the altered regions sufficiently, or the peripheries of the fine holes 55 and the altered regions can be made sufficiently brittle.

Figure 7:
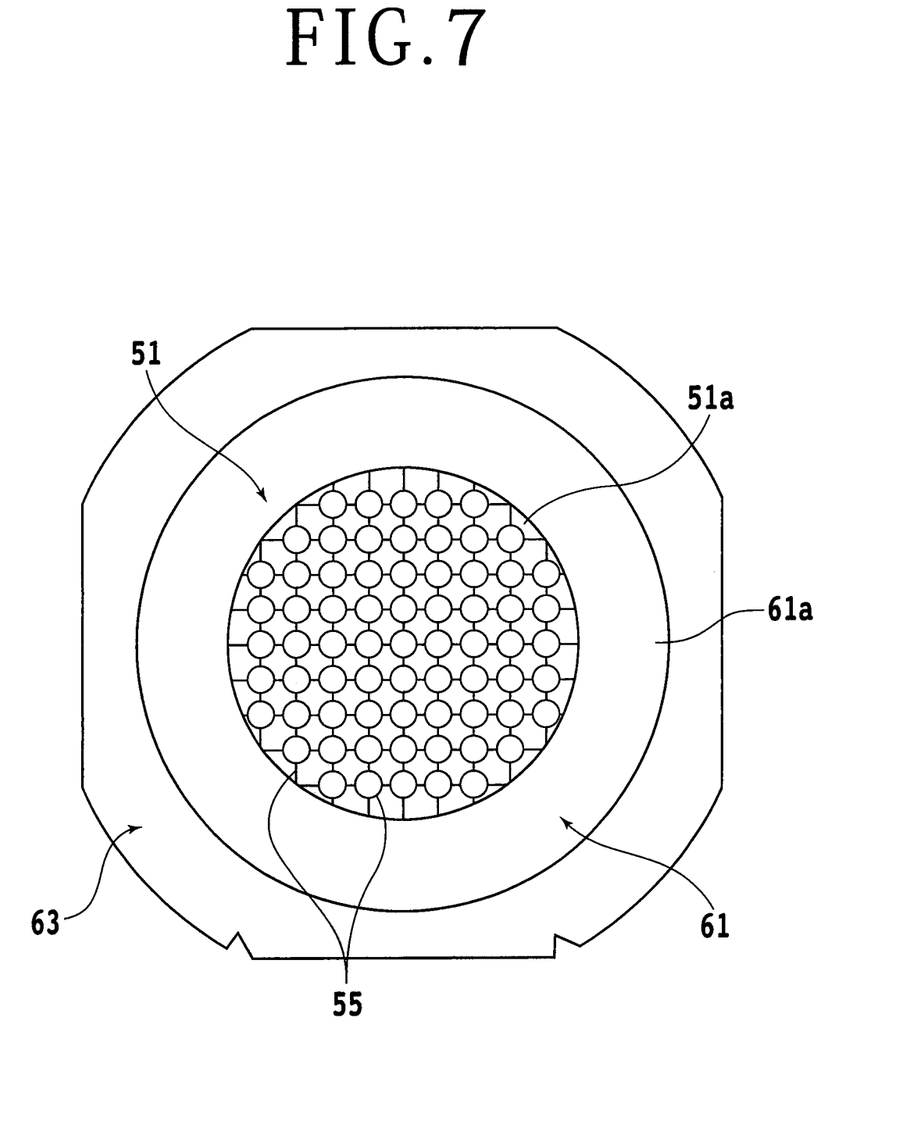
FIG. 7 is a plan view of assistance in explaining a sheet affixing step.

After the cooling step, a sheet affixing step is performed which affixes (sticks) an expanding sheet to the undersurface 51b side of the workpiece 51. FIG. 7 is a plan view of assistance in explaining the sheet affixing step. The configuration of an expanding sheet 61 used in the present embodiment is substantially the same as the configuration of the expanding sheet 41 described in the first embodiment. Specifically, the expanding sheet 61 according to the present embodiment is a circular film (tape or sheet) having a larger diameter than the workpiece 51, and a top surface 61*a* side of the expanding sheet 61 is provided with a glue layer (adhesive material layer) having an adhesive force. The expanding sheet 61 can be affixed to the undersurface 51*b* side of the workpiece 51 by bringing a central part of the top surface 61*a* side into close contact with the undersurface 51*b* side of the workpiece 51. An annular frame 63 encircling the workpiece 51 is fixed to an outer peripheral portion on the top surface 61*a* side of the expanding sheet 61.

After the sheet affixing step, a dividing step is performed which applies a force to the workpiece 51 by expanding the expanding sheet 61, and thus divides the workpiece 51 along the fine holes 55. A procedure of the dividing step according to the present embodiment may be the same as the procedure of the dividing step according to the first embodiment. The dividing step is ended when the workpiece 51 is divided into a plurality of chips with the fine holes 55 as a starting point.

Thus, the dividing method according to the present embodiment forms the fine holes (starting point regions) 55 as a starting point of division along the planned dividing lines 53 set in the workpiece 51, and thereafter heats the workpiece 51. Therefore, cracks are extended from the fine holes 55 and the altered regions of the workpiece 51, and the fine holes 55 and the altered regions of the workpiece 51 and the peripheries thereof are made further brittle. Therefore, when the force in the direction of expanding the expanding sheet 61 is applied after the workpiece 51 is heated, the workpiece 51 can be divided along the planned dividing lines 53 more surely. In addition, the dividing method according to the present embodiment does not need to pressurize the workpiece 51 by using a thin plate-shaped member. Therefore, chips adjacent to each other are prevented from moving in an approaching direction and coming into contact with each other. Thus, the dividing method according to the present embodiment can more surely divide the workpiece 51 in entirety thereof without chips coming into contact with each other.

Figure 8:
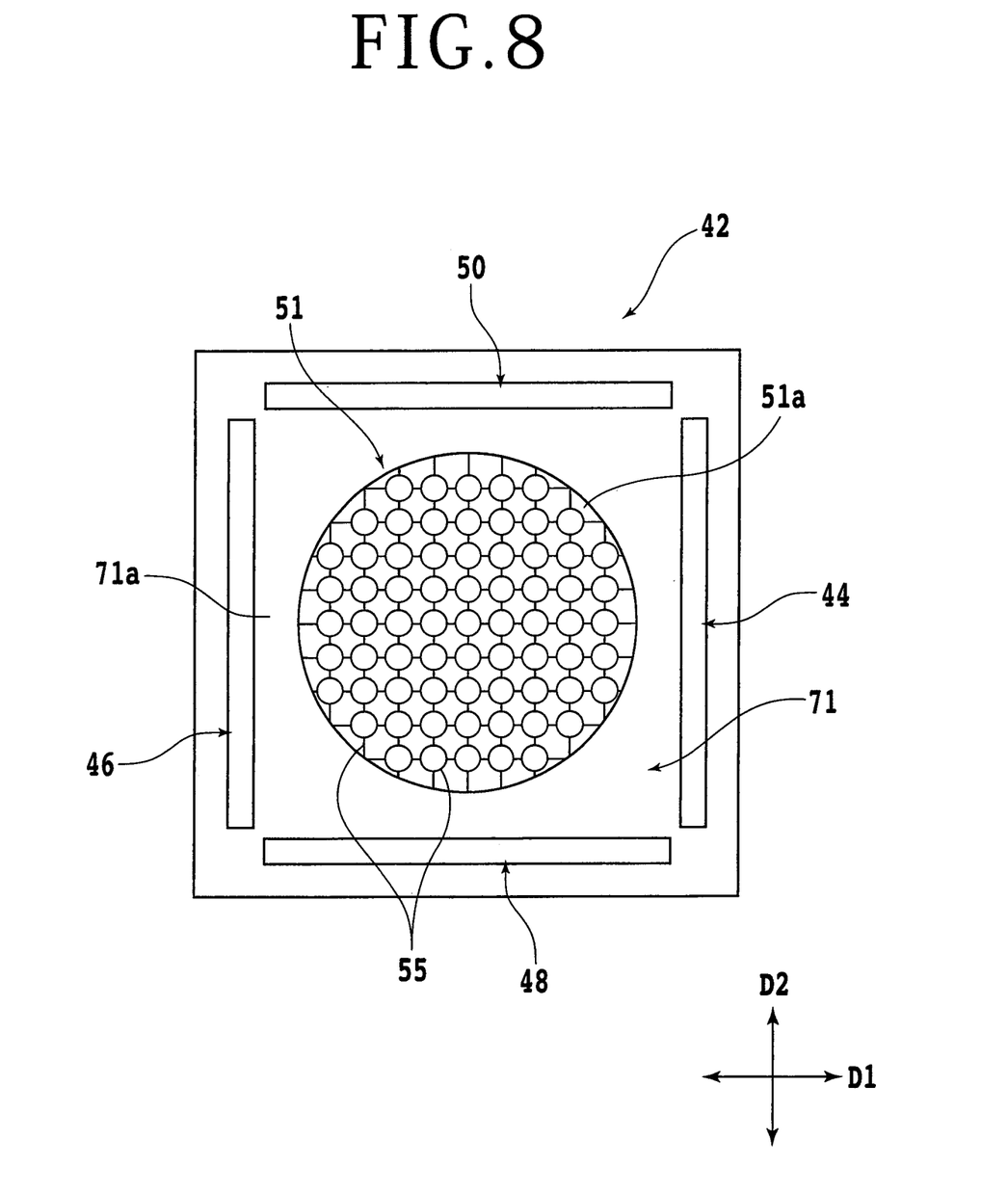
FIG. 8 is a plan view of assistance in explaining a dividing step according to a modification.

It is to be noted that the present invention is not limited to the description of the foregoing embodiments and the like, and can be changed and carried out in various manners. For example, while the expanding sheets 41 and 61 are expanded radially in the dividing steps of the foregoing embodiments, an expanding sheet can also be expanded in two directions intersecting each other, for example. FIG. 8 is a plan view of assistance in explaining a dividing step according to a modification. The dividing step according to the modification is performed by using an expanding apparatus 42 shown in FIG. 8, for example. The expanding apparatus 42 includes a plurality of sandwiching units (a first sandwiching unit 44, a second sandwiching unit 46, a third sandwiching unit 48, and a fourth sandwiching unit 50) for sandwiching an expanding sheet 71. Each of the sandwiching units includes a top surface side contact portion in contact with a top surface 71*a* side of the expanding sheet 71 and an undersurface side contact portion in contact with an undersurface side of the expanding sheet 71. Each of the sandwiching units sandwiches the expanding sheet 71. The first sandwiching unit 44 and the second sandwiching unit 46 are arranged in positions such that the workpiece 51 is interposed therebetween in a first direction D1. The first sandwiching unit 44 and the second sandwiching unit 46 can move so as to be separated from each other along the first direction D1. In addition, the third sandwiching unit 48 and the fourth sandwiching unit 50 are arranged in positions such that the workpiece 51 is interposed therebetween in a second direction D2 substantially perpendicular to the first direction D1. The third sandwiching unit 48 and the fourth sandwiching unit 50 can move so as to be separated from each other along the second direction D2.

In the dividing step according to the modification, first, the expanding sheet 71 is sandwiched by each of the sandwiching units. Next, as shown in FIG. 8, the first sandwiching unit 44 and the second sandwiching unit 46 are moved so as to be separated from each other along the first direction D1, and the third sandwiching unit 48 and the fourth sandwiching unit 50 are moved so as to be separated from each other along the second direction D2. Consequently, the expanding sheet 71 is expanded in the first direction D1 and the second direction D2, and the workpiece 51 is divided into a plurality of chips.

Incidentally, after the dividing step, it is desirable to fix an annular frame to the expanding sheet 71, and cut the expanding sheet 71 in conformity with the frame. That is, the dividing step according to the modification is performed before the annular frame is fixed to the expanding sheet 71. In addition, a rectangular (or band-shaped) expanding sheet before being cut into a circular shape is preferably used as the expanding sheet 71. While FIG. 8 represents a case where the workpiece 51 is divided, the workpiece 11 can also be divided similarly.

In addition, while the sheet affixing step is performed after the cooling step in the foregoing embodiment, it suffices to perform the sheet affixing step at least before the dividing step. It is also possible, for example, to perform the sheet affixing step before the fine hole forming step (starting point region forming step). The sheet affixing step may be performed in place of the protective member affixing step. In this case, the expanding sheet functions as the protective member.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A dividing method for dividing a plate-shaped workpiece, the dividing method comprising:
   a starting point region forming step of forming a starting point region serving as a starting point of division along a planned dividing line set on the workpiece, wherein said starting point region forming step is performed by applying a laser to the workpiece to create a modified layer including cracks;
   a heating step of heating the workpiece after performing said starting point region forming step, wherein during said heating step, said cracks formed during said starting point region forming step are extended;
   a cooling step of cooling the workpiece after performing said heating step;
   a dividing step of dividing the workpiece along the starting point region by applying a force to the workpiece after performing said cooling step; and
   a sheet affixing step of affixing an expanding sheet to the workpiece before performing said dividing step, wherein said sheet affixing step is performed after performing said cooling step;
   said dividing step applying the force to the workpiece by expanding the expanding sheet.

2. The dividing method according to claim 1, wherein said heating step and said cooling step are each performed repeatedly, thereby extending cracks formed in the starting point region.

3. A dividing method for dividing a plate-shaped workpiece, the dividing method comprising:
 a starting point region forming step of forming a starting point region serving as a starting point of division along a planned dividing line set on the workpiece;
 a heating step of heating the workpiece after performing said starting point region forming step;
 a cooling step of cooling the workpiece after performing said heating step;
 a dividing step of dividing the workpiece along the starting point region by applying a force to the workpiece after performing said cooling step; and
 a sheet affixing step of affixing an expanding sheet to the workpiece before performing said dividing step, wherein said sheet affixing step is performed after performing said cooling step;
 said dividing step applying the force to the workpiece by expanding the expanding sheet,
 wherein said starting point region forming step comprises using a laser beam with a condensing point that extends in a region from a top surface of the workpiece to a bottom surface of the workpiece, thereby forming a plurality of fine holes and altered regions surrounding each of the fine holes.

4. The dividing method according to claim 3, further comprising using a condensing point correcting plate for condensing the laser beam such that the condensing point extends in the region from the top surface of the workpiece to the bottom surface of the workpiece.

5. The dividing method according to claim 1, wherein said heating step is performed with a heating surface set at 180° C. for a time period of one minute.

6. The dividing method according to claim 1, wherein the workpiece comprises a silicon wafer.

7. The dividing method according to claim 1, wherein the workpiece is formed of GaN.

8. The dividing method according to claim 1, wherein the workpiece is formed of SiC.

9. The dividing method according to claim 1, wherein the workpiece is formed of a ceramic.

10. The dividing method according to claim 1, wherein the workpiece is formed of lithium tantalate.

11. The dividing method according to claim 1, wherein the workpiece is formed of lithium niobate.

12. The dividing method according to claim 1, wherein the workpiece is formed of a metal.

13. The dividing method according to claim 1, wherein the workpiece is formed of sapphire.

14. The dividing method according to claim 1, wherein said heating step is performed using a hot plate.

* * * * *